United States Patent
Dewey et al.

(10) Patent No.: US 8,878,363 B2
(45) Date of Patent: Nov. 4, 2014

(54) FERMI-LEVEL UNPINNING STRUCTURES FOR SEMICONDUCTIVE DEVICES, PROCESSES OF FORMING SAME, AND SYSTEMS CONTAINING SAME

(75) Inventors: Gilbert Dewey, Hillsboro, OR (US);
Niloy Mukherjee, Beaverton, OR (US);
Matthew Metz, Portland, OR (US);
Jack T. Kavalieros, Portland, OR (US);
Nancy M. Zelick, Beaverton, OR (US);
Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 113 days.

(21) Appl. No.: 12/459,254

(22) Filed: Jun. 26, 2009

(65) Prior Publication Data

US 2010/0327377 A1    Dec. 30, 2010

(51) Int. Cl.
| | |
|---|---|
| *H01L 23/48* | (2006.01) |
| *H01L 23/52* | (2006.01) |
| *H01L 29/40* | (2006.01) |
| *H01L 29/47* | (2006.01) |
| *H01L 23/485* | (2006.01) |
| *H01L 29/78* | (2006.01) |
| *H01L 21/285* | (2006.01) |
| *H01L 23/532* | (2006.01) |
| *H01L 29/49* | (2006.01) |
| *H01L 21/768* | (2006.01) |
| *H01L 29/66* | (2006.01) |

(52) U.S. Cl.
CPC ........ *H01L 21/28525* (2013.01); *H01L 23/485* (2013.01); *H01L 29/7853* (2013.01); *H01L 23/53266* (2013.01); *H01L 29/7839* (2013.01); *H01L 29/4966* (2013.01); *H01L 23/53223* (2013.01); *H01L 21/76831* (2013.01); *H01L 29/66643* (2013.01); *H01L 23/53252* (2013.01)
USPC ........... 257/761; 257/473; 257/734; 257/741

(58) Field of Classification Search
CPC ................... H01L 21/28525; H01L 21/76831; H01L 23/485; H01L 23/53223; H01L 23/53266; H01L 23/53252; H01L 29/7853; H01L 29/4966; H01L 29/66643; H01L 29/7839
USPC .................. 257/473, 741, E21.425, E29.311, 257/E29.271, 734, 761
See application file for complete search history.

(56) References Cited

U.S. PATENT DOCUMENTS

| | | | | |
|---|---|---|---|---|
| 6,090,723 | A * | 7/2000 | Thakur et al. | 438/778 |
| 6,093,944 | A * | 7/2000 | VanDover | 257/310 |
| 2002/0179980 | A1* | 12/2002 | Yagishita et al. | 257/384 |
| 2005/0280104 | A1* | 12/2005 | Li | 257/406 |
| 2007/0212896 | A1* | 9/2007 | Olsen et al. | 438/758 |
| 2007/0218623 | A1* | 9/2007 | Chua et al. | 438/240 |
| 2007/0257303 | A1* | 11/2007 | Liu et al. | 257/315 |
| 2008/0050870 | A1* | 2/2008 | Yamamoto | 438/230 |
| 2008/0230804 | A1* | 9/2008 | Nishi et al. | 257/190 |

(Continued)

*Primary Examiner* — Teresa M Arroyo
(74) *Attorney, Agent, or Firm* — Blakely, Sokoloff, Taylor & Zafman LLP

(57) ABSTRACT

An interlayer is used to reduce Fermi-level pinning phenomena in a semiconductive device with a semiconductive substrate. The interlayer may be a rare-earth oxide. The interlayer may be an ionic semiconductor. A metallic barrier film may be disposed between the interlayer and a metallic coupling. The interlayer may be a thermal-process combination of the metallic barrier film and the semiconductive substrate. A process of forming the interlayer may include grading the interlayer. A computing system includes the interlayer.

17 Claims, 9 Drawing Sheets

(56) References Cited

U.S. PATENT DOCUMENTS

| | | | |
|---|---|---|---|
| 2008/0280405 A1* | 11/2008 | Tsuchiya et al. | 438/199 |
| 2008/0295879 A1* | 12/2008 | Atanackovic | 136/238 |
| 2009/0042344 A1* | 2/2009 | Ye et al. | 438/172 |
| 2009/0108308 A1* | 4/2009 | Yang et al. | 257/288 |
| 2010/0052035 A1* | 3/2010 | Koike et al. | 257/321 |
| 2010/0320510 A1* | 12/2010 | Loh et al. | 257/288 |
| 2011/0169105 A1* | 7/2011 | Okubo | 257/411 |

* cited by examiner

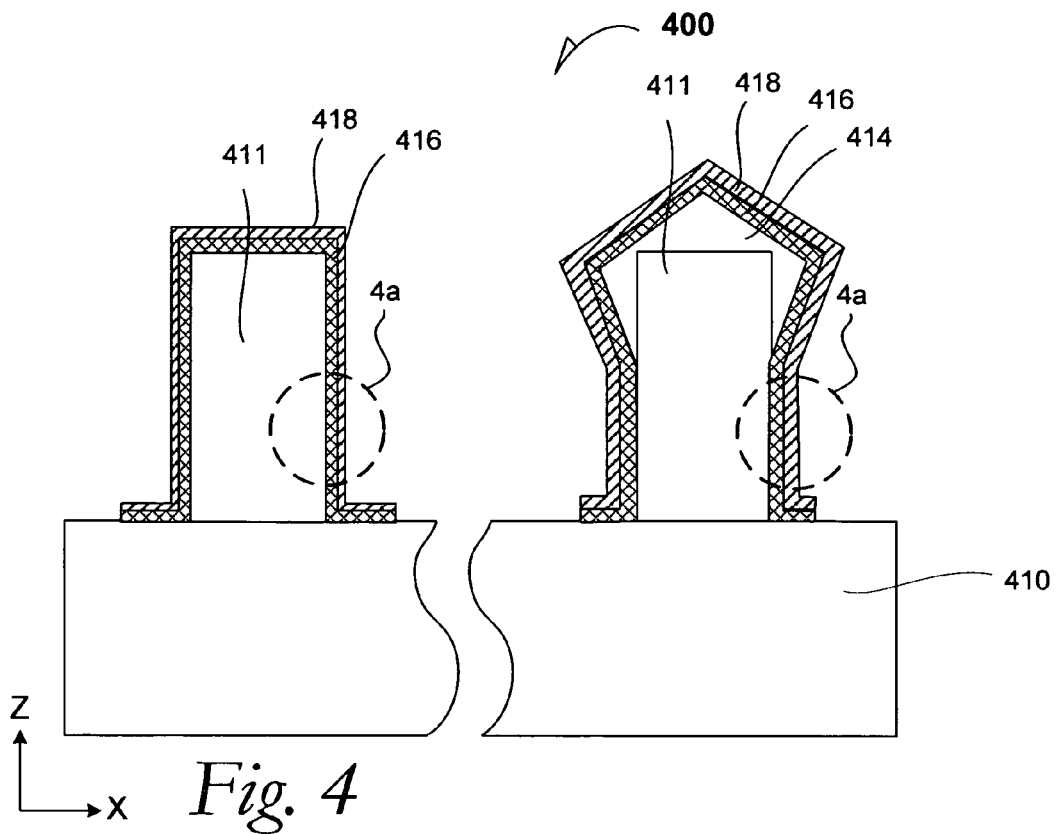
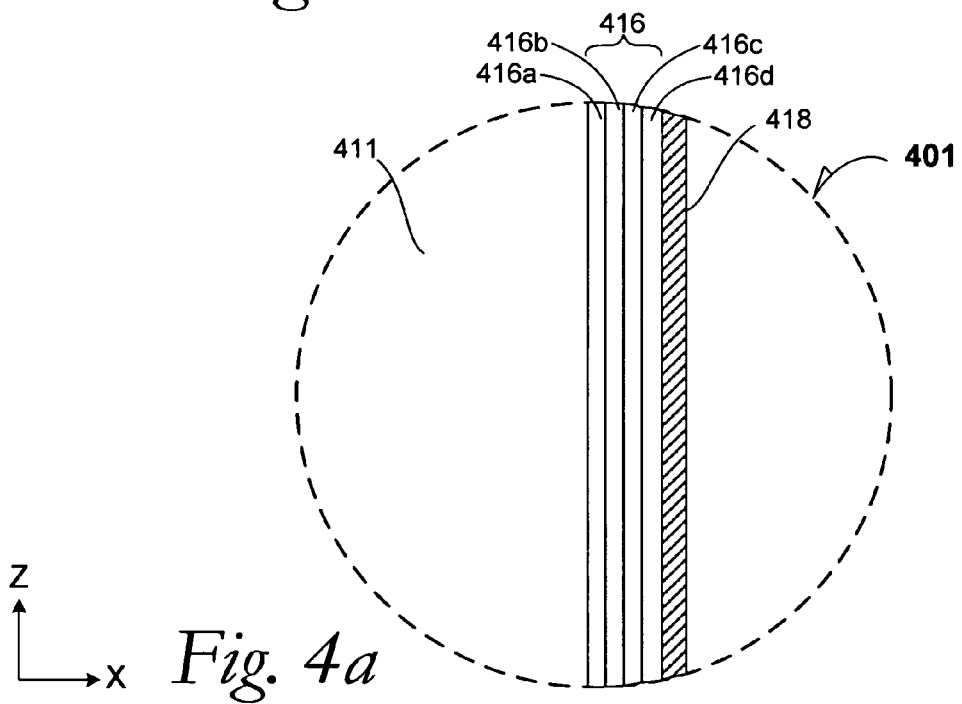
Fig. 4
Fig. 4a

FERMI-LEVEL UNPINNING STRUCTURES FOR SEMICONDUCTIVE DEVICES, PROCESSES OF FORMING SAME, AND SYSTEMS CONTAINING SAME

TECHNICAL FIELD

A variety of electronic and optoelectronic devices use transistors for microelectronic applications. Challenges involved with such devices include resistive effects as miniaturization continues to track Moore's Law.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 2b is a graph that illustrates an increase in diode current for similar example embodiments illustrated in FIG. 2a;

FIG. 4 is a cross-section elevation of a semiconductive device according to an example embodiment;

FIG. 4a is a detail section taken from FIG. 4 along the section line 4a according to an example embodiment;

DETAILED DESCRIPTION

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

Figure 1:
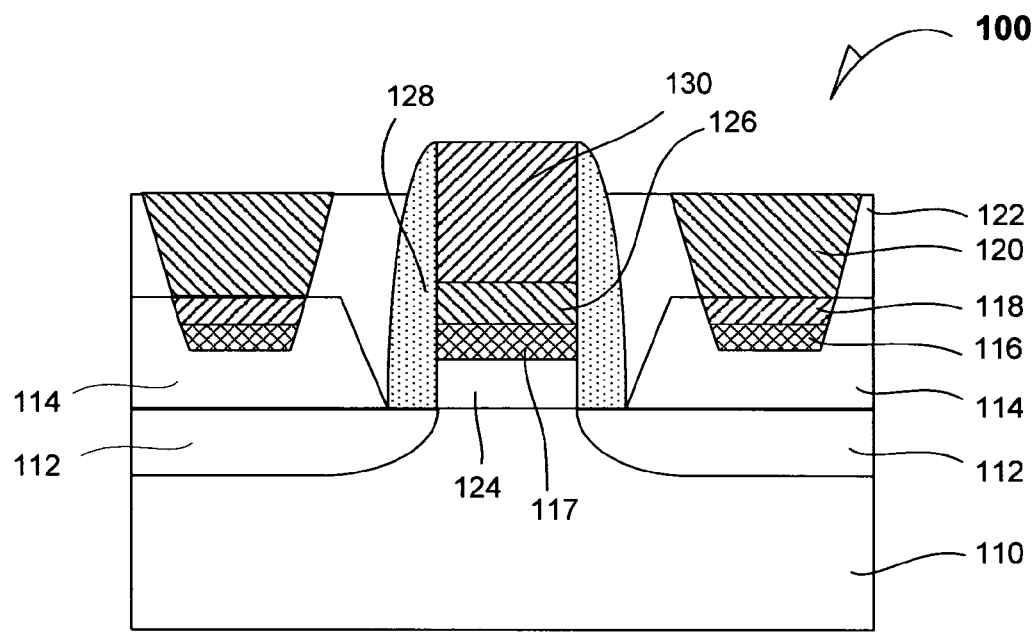
FIG. 1 is a cross-section elevation of a semiconductive device according to an example embodiment.
Figure 1:
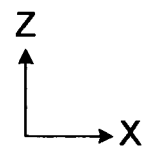

FIG. 1 is a cross-section elevation of a semiconductive device 100 according to an example embodiment. The semiconductive device 100 may be used to form NMOS or PMOS integrated circuits. The semiconductive device 100 includes a semiconductive substrate 110. In an embodiment, the semiconductive substrate 110 includes source- and drain wells 112. An epitaxial semiconducting film 114 is disposed above the semiconductive substrate 110. The semiconductive substrate 110 may be p- or n-doped silicon. The semiconductive substrate 110 may be a III-V semiconductive material such as gallium arsenide.

In an embodiment, a source-drain (S/D) interlayer 116 is formed in the epitaxial semiconducting film 114. The S/D interlayer 116 is in contact with a metallic coupling 118. The S/D interlayer 116 is a rare-earth oxide (REOx) according to an embodiment. The REOx has a thickness and a composition that reduces Fermi-level pinning that is indigenous to the semiconductive substrate 110 or the epitaxial semiconducting film 114 and the metallic coupling 118. In an embodiment, a fill metal material 120 is used as a contact to allow communication into an out of the semiconductive device 110. The fill metal material 120 is filled into recesses that are disposed in interlayer dielectric material 122. The interlayer dielectric material 122 is depicted at a given height for illustrative purposes.

As described and in reference to the REOx material of the interlayer 116, the semiconductive device 100 is also referred to as a metal-insulator-semiconductor (MIST) contact scheme such as is useful in both an NMOS and a PMOS contact. In an example embodiment, the interlayer 116 has a thickness range from 2.5 Å to 50 Å, and the metallic coupling 118 is a mid-work function (mid WF) metal. In an example embodiment, the interlayer 116 has a thickness range from 2.5 Å to 50 Å, and the metallic coupling 118 is a NiSi mid-WF metal. The REOx material of the interlayer 116 acts to lower the Schottky barrier height (SBH) that lowers NMOS contact resistance between the metallic coupling 118 and the semiconductive substrate 110. In an embodiment, the SBH phenomena was unpinned from about 0.45 eV to about 0.38 eV. In an embodiment when an aluminum metallic coupling 118 was used, and the SBH phenomena was unpinned by a difference of 0.3 eV.

In an embodiment, the REOx interlayer 116 is yttrium oxide. In an embodiment, the REOx interlayer 116 is non-stoichiometric yttrium oxide. In an embodiment, the REOx interlayer 116 is a lanthanide-series metal oxide. In an embodiment, the REOx interlayer 116 is non-stoichiometric lanthanide-series metal oxide. In an embodiment, the REOx interlayer 116 is an actinide-series metal oxide. In an embodiment, the REOx interlayer 116 is non-stoichiometric actinide-series metal oxide. In an example embodiment, the REOx interlayer 116 is lanthanum oxide. In an example embodiment, the REOx interlayer 116 is gadolinium oxide. In an example embodiment, the REOx interlayer 116 is scandium oxide. In an example embodiment, the REOx interlayer 116 is ytterbium oxide. In an example embodiment, the REOx interlayer 116 is lutetium oxide.

Processing to form the REOx interlayer 116 is carried out by depositing precursors and oxidizing according to an embodiment. In a process embodiment, a rare-earth metal film is formed inside a deposition tool and the "vacuum is broken" inside the tool to allow the rare earth film to oxidize to a non-stoichiometric REOx interlayer 116. In an embodiment, a non-stoichiometric REOx interlayer 116 is formed by vacuum breaking to allow a native oxide to form and integrate into the rare-earth metal such that the REOx interlayer 116 is formed. In a processing embodiment, thermal oxidation is carried out.

A gate stack is also disposed on the semiconductive substrate 110 according to an embodiment. A gate dielectric 124 is in contact with the semiconductive substrate 110, and a gate-stack interlayer 117 is disposed above and on the gate dielectric 124. A metal gate electrode 126 is disposed above and on the interlayer 116. In an embodiment, the metal gate electrode 126 is a high-WF metal. The REOx material of the gate-stack interlayer 117 in the gate stack acts to lower the SBH that results in a highly n-type gate work function.

In an embodiment, the metal gate electrode 126 is a titanium (Ti) material. In an embodiment, the metal gate electrode 126 is a platinum (Pt) material. In an embodiment, the metal gate electrode 126 is a gold (Au) material. In an embodiment, the metal gate electrode 126 is a nickel (Ni) material. In an embodiment, the metal gate electrode 126 is a combination of at least two of titanium, platinum, gold, and nickel. In an embodiment, the metal gate electrode 126 has a thickness (Z-direction) from 60 Å to 140 Å. In an embodiment, the metal gate electrode 126 has a thickness of 100 Å. In an embodiment, the high-k gate dielectric 124 has a thickness of 100 Å and the metal gate electrode 126 has a thickness of 100 Å. The gate structure further includes spacers 128 and a dielectric cap layer 130.

In an embodiment, the gate dielectric is a high-k gate dielectric 124 that is formed above (Z-dimension) and on the semiconductive substrate 110. The interface that forms between the gate dielectric 124 and the semiconductive substrate 110 is the semiconductor/dielectric interface. In an embodiment, the high-k gate dielectric 124 has a thickness from 20 Å to 60 Å. In an embodiment, the high-k gate dielectric 124 is hafnium oxide ($HfO_2$). In an embodiment, the high-k gate dielectric 124 is alumina ($Al_2O_3$). In an embodiment, the high-k gate dielectric 124 is tantalum pentoxide ($Ta_2O_5$). In an embodiment, the high-k gate dielectric 124 is zirconium oxide ($ZrO_2$). In an embodiment, the high-k gate dielectric 124 is lanthanum aluminate ($LaAlO_3$). In an embodiment, the high-k gate dielectric 124 is gadolinium scandate ($GdScO_3$). As used herein, the phrase "high-k" refers to materials that have a dielectric constant as large or larger than that of silica, which is about 4.

Figure 2A:
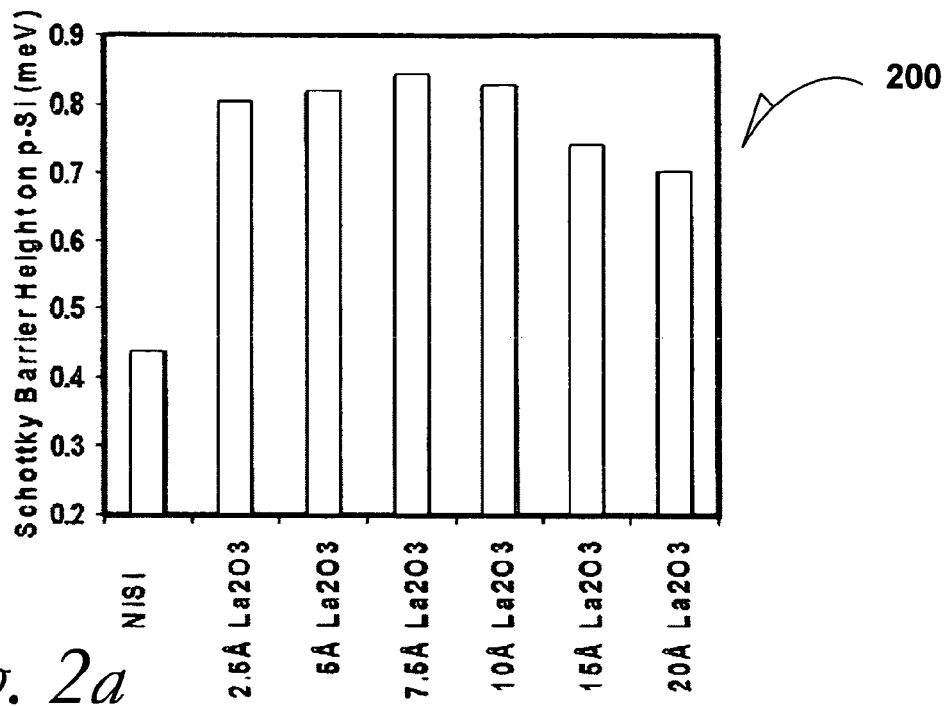
FIG. 2a is a graph that illustrates an SBH reduction with respect to a p-type silicon devices in comparison to an NiSi metallic coupling alone according to example embodiments.

FIG. 2a is a graph 200 that illustrates an SBH reduction with respect to p-type silicon devices in comparison to a Ni metallic coupling alone according to example embodiments. Based upon comparison of a Ni metallic coupling alone, it can be seen that as much as a 300 meV increase in a p-type semiconductor is achieved by use of several embodiments of the interlayer 116 and the gate-stack interlayer 117. Example embodiments show thin interlayer films of $La_2O_3$, ranging from 2.5 Å to 20 Å being used to increase the SBH. In an embodiment, the interlayer 116 has a thickness of 10 Å of $La_2O_3$ and the high-k gate dielectric layer 124 has a thickness of 20 Å of $Ta_2O_5$.

Figure 2B:
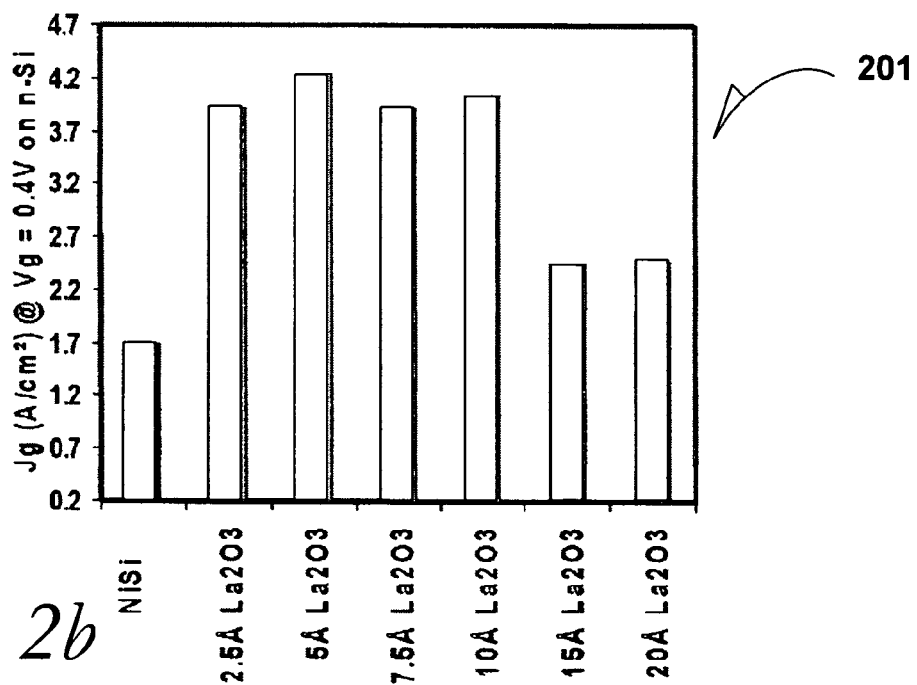

FIG. 2b is a graph 201 that illustrates an increase in diode current on an n-type semiconductor for similar example embodiments illustrated in FIG. 2a Consequently for NMOS devices, the extra interface resistance expected for the oxide interlayer 116 is mitigated by the extra current obtained from Fermi-level unpinning. Indeed, useful increases in diode current are observed.

Figure 3:
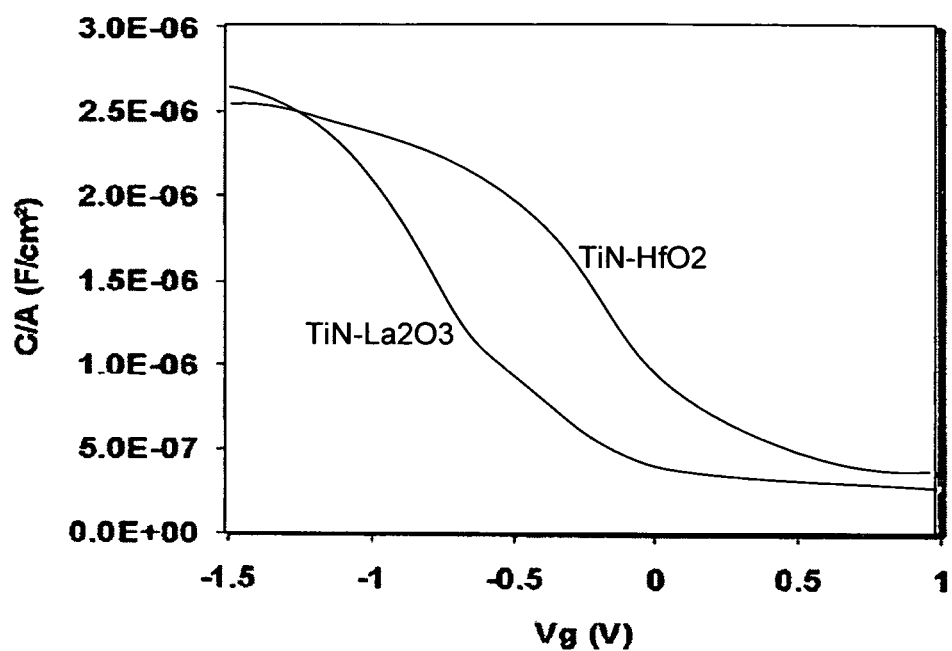
FIG. 3 is a graph that illustrates an effective work-function shift according to an example embodiment.

FIG. 3 is a graph 300 that illustrates an effective work-function shift according to an example embodiment. The capacitance-voltage characteristics for a mid-gap metal and an REOx interlayer are demonstrated. A mid-gap metal of TiN and an REOx interlayer were used for the metallic coupling 118 and the interlayer 116, respectively. The $La_2O_3$ interlayer when used experienced an approximate 500 mV work-function shift lower toward a work function that approaches the conduction band edge of silicon.

FIG. 4 is a cross-section elevation of a semiconductive device 400 according to an example embodiment. The semiconductive device 400 may be used to form an NMOS or PMOS integrated circuits. The semiconductive device 400 includes a semiconductive substrate 410. An epitaxial semiconducting film 414 is disposed above the semiconductive substrate 410 on a fin 411a. The fins 411 and 411a act as multiple gate or a non-planar transistor structures for the semiconductive device 400. In an embodiment, the fins 411 and 411a are part of a 6-transistor (6T) static random-access memory cell where the fin 411 responds differently to the fin 411a that is enhanced with the epitaxial semiconducting film 414.

In an embodiment, an interlayer 416 is formed over the fin 411. The interlayer 416 may be any of the REOx interlayer embodiments set forth in this disclosure.

In an embodiment, the fin 411, the epitaxial semiconducting film 414, and the semiconductive substrate 410 have the qualities of being covalently bonded semiconductor compositions such as silicon and germanium. In an embodiment, the these structures such as gallium arsenide, indium-gallium arsenide, and indium phosphide are weakly ionic semiconductor compositions.

In an embodiment, the interlayer 416 is provided on the fin 411 is a strongly ionically bonded semiconductor composition. Fermi-level unpinning happens when the interlayer ionic semiconductor 416 has a strongly ionic bonding character such as when the difference in Pauling electronegativities of the cation and anion exceed 0.9. The interlayer 416 may therefore be referred to also as an ionic semiconductive film 416.

In an embodiment, a metallic coupling 418 is disposed over the ionic semiconductive film 416. It may now be seen that a planar semiconductive device may also be fabricated with an ionic semiconductive interlayer disposed upon a semiconductive substrate and in contact with a metallic coupling.

In an embodiment, the ionic semiconductive film 416 has a thickness in a range from 2.5 Å to 250 Å. The metallic coupling 418 has a thickness range from 50 Å to 500 Å. In an embodiment, the ionic semiconductive film 416 has a 5 Å thickness and the metallic coupling 418 has a 50 Å thickness. In an embodiment, the ionic semiconductive film 416 has a 10 Å thickness and the metallic coupling 418 has a 100 Å thickness. In an embodiment, the ionic semiconductive film 416 has 200 Å thickness and the metallic coupling 418 has a 400 Å thickness. In an embodiment, the ionic semiconductive film 416 has 250 Å thickness and the metallic coupling 418 has a 500 Å thickness.

Composition embodiments of the ionic semiconductive film 416 as an interlayer that reduces Fermi-level pinning are applied to several ionic semiconductive structures. In an embodiment, the ionic semiconductive film 416 is doped to achieve a useful ionically bonded film 416. An n-dopant embodiment includes at least one of aluminum and gallium in, for example, a ZnO ionic semiconductor. An n-dopant embodiment includes at least one of iodine and aluminum in, for example, a ZnS ionic semiconductor. An n-dopant embodiment includes indium in, for example, a SnO ionic semiconductor. A p-dopant embodiment includes copper in, for example, a ZnS ionic semiconductor. Other suitable ionic semiconductors may be used depending upon the specific application.

In an embodiment, the ionic semiconductive film 416 is an oxide. In an embodiment, the ionic semiconductive film 416 is semiconductive zinc oxide ($ZnO_2$). In an embodiment, the ionic semiconductive film 416 is semiconductive indium-tin oxide ($InSnO_2$). In an embodiment, the ionic semiconductive film 416 is semiconductive tin oxide ($SnO_2$). In an embodiment, the ionic semiconductive film 416 is semiconductive and non-stoichiometric titanium oxide ($TiO_2$). In an embodiment, the semiconductive film is a mixture of any two of the enumerated semiconductive oxides. In an embodiment, the semiconductive film is a mixture of any three of the enumerated semiconductive oxides. In an embodiment, the semiconductive film is a mixture of all of the enumerated semiconductive oxides.

Other oxides may be used depending upon a specific application. For example a non-stoichiometric zinc oxide may be used in stead of $ZnO_2$. Consequently, any combination of two or more oxides may be used such as stoichiometric $ZnO_2$ with non-stoichiometric indium-tin oxide. Any of the enumerated oxides may be applied in a non-stoichiometric ratio.

In an embodiment, the ionic semiconductive film 416 is a sulfide. In an embodiment, the ionic semiconductive film 416 is semiconductive zinc sulfide (ZnS). In an embodiment, the ionic semiconductive film 416 is semiconductive zinc aluminum sulfide (Zn(Al)S. In an embodiment, the ionic semiconductive film 416 is semiconductive cadmium sulfide (CdS). In an embodiment, the semiconductive film is a mixture of any two of the enumerated semiconductive sulfides. In an embodiment, the semiconductive film is a mixture of all of the enumerated semiconductive sulfides.

Other sulfides may be used depending upon a specific application. For example a non-stoichiometric zinc sulfide may be used in stead of ZnS. Consequently, any combination of two or more sulfides may be used such as stoichiometric ZnS with non-stoichiometric gallium sulfide. Any of the enumerated sulfides may be applied in a non-stoichiometric ratio.

In an embodiment, the ionic semiconductive film 416 is a nitride. In an embodiment, the ionic semiconductive film 416 is semiconductive aluminum nitride (AlN). Other nitrides may be used depending upon a specific application. For example, non-stoichiometric aluminum nitride may be used. In an embodiment, the ionic semiconductive film 416 is semiconductive gallium nitride (GaN). In an embodiment, the ionic semiconductive film 416 is semiconductive indium nitride (InN). Other suitable ionic semiconductors may be used depending upon the specific application.

Processing to form the ionic semiconductor interlayer 416 is carried out by depositing the ionic materials as a film from ionic precursors according to an embodiment. In a process embodiment, a zinc film 416 is formed inside a deposition tool and the "vacuum is broken" inside the tool to allow the film to oxidize to a non-stoichiometric zinc oxide first film 416. In an embodiment, a non-stoichiometric zinc oxide film 416 is formed by vacuum breaking to allow a native oxide to form and integrate into the zinc film 416. In a processing embodiment, thermal nitridation is carried out. In a processing embodiment, thermal sulfidation is carried out.

In an embodiment, the interlayer 416 is a silicide that has been formed after deposition and anneal of the metallic coupling 418. For example, a titanium metallic coupling 418 is deposited and annealed such that a titanium silicide interlayer 416 has formed. Other suitable metal silicides may be formed according to a given application.

In an embodiment, the epitaxial semiconducting film 414 or the fin 411 is a non-silicon semiconductive material such as a III-V semiconductor. In a process embodiment, a GaAs epitaxial semiconducting film 414 is covered with a titanium metallic coupling, followed by annealing to form a GaAsTi interlayer 416.

Figure 5:
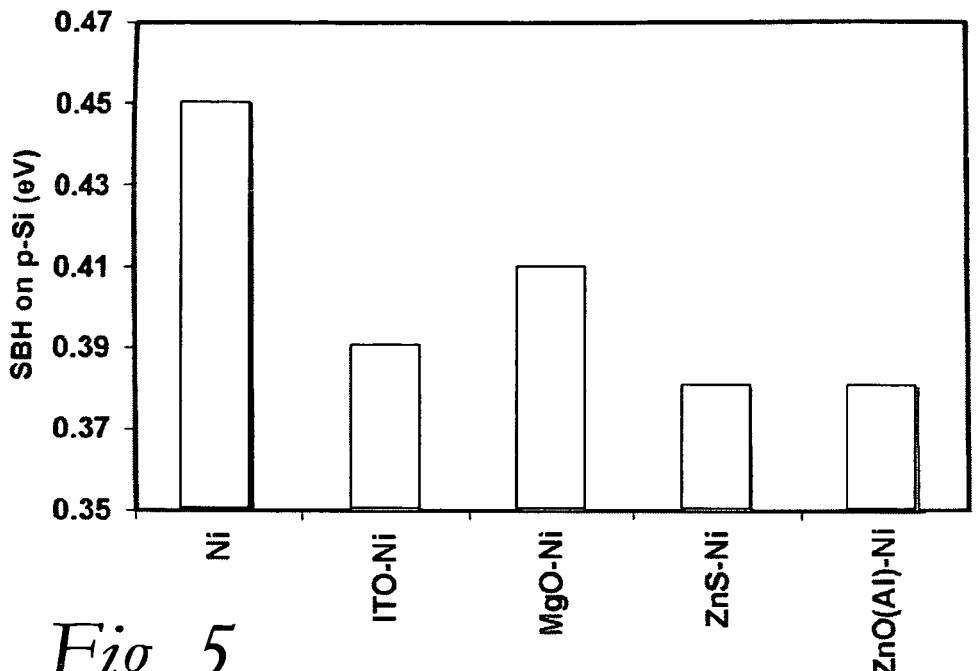
FIG. 5 is a graph that illustrates Schottky barrier height reduction with respect to a p-type silicon fin FET device such as illustrated in FIG. 4a according to several example embodiments.

FIG. 5 is a graph 500 that illustrates SBH reduction with respect to a p-type silicon fin FET device such as illustrated in FIG. 4a according to several embodiments. Several examples were demonstrated. An indium-tin oxide ionic semiconductive film was placed in contact with a Ni metallic coupling (ITO—Ni) and compared to Fermi-level pinning with a Ni metallic coupling alone. As illustrated the SBH was lowered from about 0.45 eV with a Ni metallic coupling alone, to about 0.39 eV. In an embodiment, a magnesium oxide ionic semiconductive film was placed in contact with a Ni metallic coupling (MgO—Ni) and the SBH was lowered from about 0.45 eV to about 0.41 eV. In an embodiment, a zinc sulfide ionic semiconductive film was placed in contact with a Ni metallic coupling (ZnS—Ni) and the SBH was lowered from about 0.45 eV to about 0.37 eV. In an embodiment, an aluminum-doped zinc oxide ionic semiconductive film was placed in contact with a Ni metallic coupling (ZnO(Al)—Ni) and the SBH was lowered from about 0.45 eV to about 0.37 eV. In any event, a useful reduction of the SBH was observed in these example embodiments.

FIG. 4a is a detail section taken from FIG. 4 along the section line 4a according to an example embodiment. The detail section 401 includes the fin 411 (including the S/D wells 412 if present) disposed above the semiconductive substrate. The interlayer 416 is depicted as a graded film including at least an ionic semiconductor first film 416a and an ionic semiconductor subsequent film 416d. As illustrated, however, the interlayer is a graded composite including the ionic semiconductor first film 416a, second film 416b, third film 416c, and the ionic semiconductor subsequent film 416d. In an embodiment, the number of graded ionic semiconductor films is three. In an embodiment, the number of graded ionic semiconductor films is from four to 30.

In an embodiment, grading of the interlayer 416 is carried out to have the ionic semiconductor first film 416a to be least ionic and the ionic semiconductor subsequent film 416d to be most ionic.

In an embodiment, formation of the graded interlayer 416 is carried out by molecular beam epitaxy (MBE) such that atomic layers are sequentially grown in contact with the semiconductive fin 411. In an embodiment, MBE is carried out at temperatures between 400° C. and 500° C. In an embodiment, formation of the graded interlayer 416 is carried out by chemical vapor deposition (CVD) such that layers are sequentially grown beginning with contacting with the semiconductive fin 411 and building thereupon. In an embodiment, formation of the graded interlayer 416 is carried out by metal-organic chemical vapor deposition (MOCVD) such that atomic layers are sequentially grown beginning with contact with the semiconductive fin 411 and building thereupon. In an embodiment, formation of the graded interlayer 416 is carried out by ultra-high chemical vapor deposition (UHCVD) such that atomic layers are sequentially grown. In an embodiment, formation of the graded interlayer 416 is carried out by liquid-phase epitaxial deposition (LPE) such that atomic layers are sequentially grown.

Figure 6:
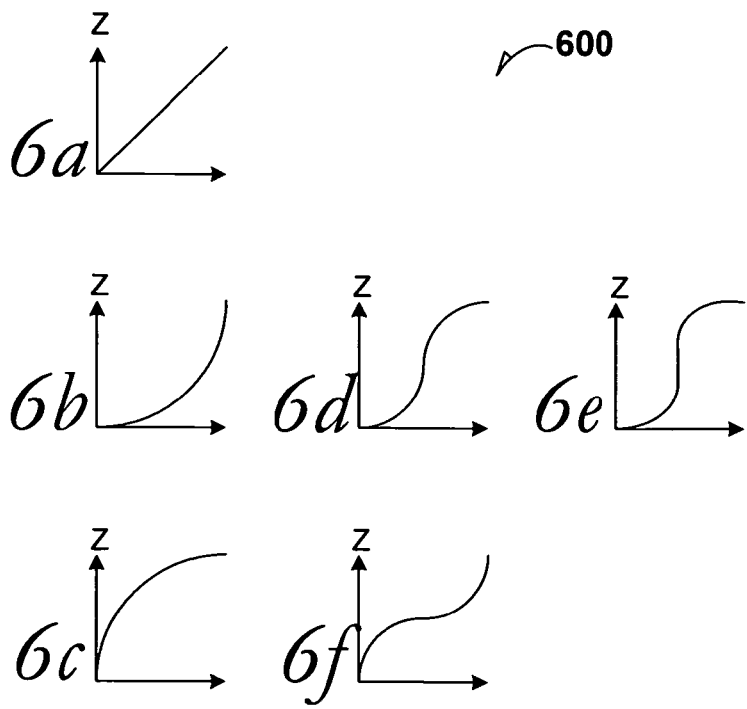
FIG. 6 depicts graphical representations of chemical similarity for sequences of graded ionic semiconductor films according to several embodiments.

FIG. 6 depicts graphical representations 600 of chemical similarity for sequences of graded ionic semiconductor films according to several embodiments. In an embodiment, the interlayer 416 (e.g. FIG. 4a) is disposed on the fin 411 and the interlayer 416 is a sequential composite including the first film 416a and the subsequent film 416d. In an embodiment, the interlayer 416 includes graded oxide embodiments and the subsequent film 416d is up to a 30th film after the first film 416a according to any of the several disclosed embodiments. It can now be appreciated that any of the disclosed ionic semiconductor film embodiments may be applied in a graded composite interlayer 416.

In FIG. 6a, a sequential composite of films is represented that have an approximately linear composition gradient. The abscissa coordinate (Z-coordinate) and the ordinate coordinate (other linear composition gradient coordinate) are given in arbitrary units. At the origin of the graphic representation, the concentration is represented as the ordinate, and the distance from the ionic semiconductor first film 416a to the metallic coupling 418 (e.g. metallic coupling 418 in FIG. 4a) is represented as the abscissa.

In an example embodiment with four films as illustrated in the graded composite, the linear composition gradient is achieved by making the first film 416a one-fourth the chemical equivalency of the subsequent film 416d, the second film 416b one-half the chemical equivalency of the subsequent film 416d, and the third film 416c three-fourths the chemical equivalency of the subsequent film 416d.

Other disclosed ionic semiconductor film-count embodiments are also useful graded-film interlayer embodiments. For example, grading may be accomplished by using an indium-tin oxide first film 416a, and an aluminum-doped zinc oxide subsequent film 416d may be configured. It can now be also appreciated that grading may begin with a non-stoichiometric first film 416a that is less ionic, to a stoichiometric subsequent film 416d that is more ionic.

In FIG. 6b, a sequential composite of ionic semiconductive films is represented that have an approximately positive (increasing) exponential composition gradient. The ordinate and abscissa coordinates are given in arbitrary units. At the origin of the graphic representation, the concentration is represented as the ordinate, and the distance from the ionic semiconductor first film 416a to the metallic coupling 418 (e.g. metallic coupling 418 in FIG. 4a) is represented as the abscissa. The concentration gradient is increasing exponentially beginning at the semiconductive ionic first film 416a and ending at the subsequent film 416d. Other disclosed film-count embodiments are also useful graded ionic semiconductor film embodiments.

In FIG. 6c, a sequential composite of ionic semiconductive films is represented that have an approximately negative (decreasing) exponential composition gradient. The ordinate and abscissa are given in arbitrary units. At the origin of the graphic representation, the concentration is represented as the ordinate, and the distance from the ionic semiconductor first film 416a to the metallic coupling 418 (e.g. metallic coupling 418 in FIG. 4a) is represented as the abscissa. The concentration gradient is decreasing exponentially beginning at the first film 416a and ending at the subsequent film 416d. Other disclosed film-count count embodiments are also useful graded ionic semiconductor film embodiments.

In FIG. 6d, a sequential composite of ionic semiconductive films is represented that have an approximately positive and then an approximately negative exponential composition gradient that includes an inflection. The ordinate and abscissa are given in arbitrary units. At the origin of the graphic representation, the concentration is represented as the ordinate, and the distance from the ionic semiconductor first film 416a to the metallic coupling 418 (e.g. metallic coupling 418 in FIG. 4a) is represented as the abscissa. The concentration gradient is first increasing beginning at the first film 416a and then decreasing after an inflection to end at the subsequent film 416d. Other disclosed film-count embodiments are also useful graded ionic semiconductor film embodiments.

In FIG. 6e, a sequential composite of ionic semiconductive films is represented that have an approximately positive and an approximately negative exponential composition gradient that includes an inflection and an asymptote. The ordinate and abscissa are given in arbitrary units. At the origin of the graphic representation, the concentration is represented as the ordinate, and the distance from the ionic semiconductor first film 416a to the metallic coupling 418 (e.g. metallic coupling 418 in FIG. 4a) is represented as the abscissa. The concentration gradient is first increasing beginning with the first film 416a and then decreasing after an inflection and an asymptote to end at the subsequent film 416d. Other disclosed film-count embodiments are also useful graded ionic semiconductor film embodiments.

In FIG. 6f, a sequential composite of ionic semiconductive films is represented that have an approximately negative and an approximately positive exponential composition gradient that includes an inflection. The ordinate and abscissa are given in arbitrary units. At the origin of the graphic representation, the concentration is represented as the ordinate, and the distance from the ionic semiconductor first film 416a to the metallic coupling 418 (e.g. metallic coupling 418 in FIG. 4a) is represented as the abscissa. The concentration gradient beginning at the first film 416a is first decreasing exponentially and then increasing exponentially after an inflection to end at the subsequent film 416d. Other disclosed film-count embodiments are also useful graded ionic semiconductor film embodiments.

In a process embodiment, a zinc first film 416a is formed inside a deposition tool and the vacuum is broken inside the tool to allow the first film to oxidize to non-stoichiometric zinc oxide first film 416a. Subsequently, a subsequent zinc film 416d is formed inside the tool, and the vacuum is again broken inside the tool to allow the subsequent film to form a zinc oxide subsequent film 416d that is more ionic than the zinc oxide first film 416a.

In a processing embodiment, thermal oxidation is used to achieve the graded interlayer 416. In an embodiment, nitridation is used to form the graded interlayer 416. In an embodiment, sulfidization is used to form the graded interlayer 416.

Figure 7:
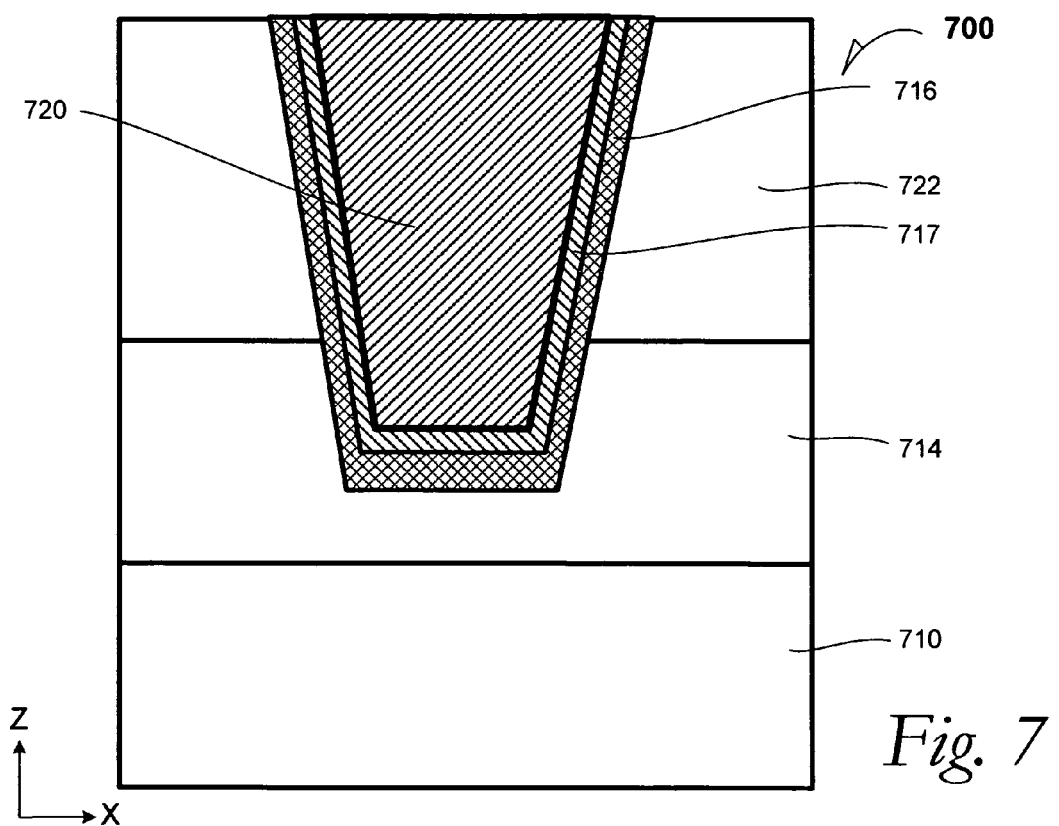
FIG. 7 is a cross-section elevation of a semiconductive device according to an example embodiment.

FIG. 7 is a cross-section elevation of a semiconductive device 700 according to an example embodiment. The semiconductive device 700 may be used to form an NMOS or PMOS integrated circuits. The semiconductive device 700 includes a semiconductive substrate 710. In an embodiment, the semiconductive substrate 710 may include source- and drain wells. An epitaxial semiconducting film 714 is disposed above the semiconductive substrate 710 and an ILD 722 may be present into which a recess is formed to allow electrical coupling.

In an embodiment, a REOx film 716 is present as hafnium oxide ($HfO_2$) and at about 10 Å thickness. A metallic barrier film (MBF) 717 is present as titanium nitride (TiN) and at about 20 Å thickness. The MBF 717 is useful as a diffusion barrier. In an embodiment, the metallic barrier film 717 has a thickness range from 5 Å to 40 Å. In an embodiment formation of the MBF 717 is done by chemical vapor deposition (CVD). Several CVD options may be available such as plasma-enhanced CVD (PECVD). In an embodiment, low-pressure CVD is used. In an embodiment formation of the MBF 717 is done by atomic-layer deposition (ALD). Several ALD options may be available such as plasma-enhanced ALD. Other deposition techniques may be selected.

Processing of the REOx film 716 may be done by any disclosed method including directly depositing an REOx, native-oxide forming an REOx by breaking the vacuum in a tool, and thermal oxidizing a rare-earth metal. A given processing embodiment may be driven by a specific application.

In an embodiment, the metallic barrier film 717 has a thickness range from 2.5 Å to 25 Å. In an embodiment, the metallic barrier film 717 is a nitride such as titanium nitride (TiN). In an embodiment, the metallic barrier film 717 is tantalum nitride (TaN). In an embodiment, the metallic barrier film 717 is a metallic carbide such as titanium carbide (TiC). In an embodiment, the metallic barrier film 717 is a metallic carbide such as TaC. In an embodiment, the metallic barrier film 717 is a metallic carbide such as HfC.

In an embodiment, a contact metal 720 is filled against the metallic barrier film 717, and the contact metal 720 is selected to facilitate a useful work-function, but the metallic barrier film 717 resists diffusion of the contact metal 720 into the semiconductive portion of the device 700 such as the epitaxial film 714. During ordinary processing, temperatures of 400° C. or higher may be reached for short time periods, and the metallic barrier film 717 resists diffusion of the contact metal 720.

In an embodiment, the contact metal 720 is aluminum. In an embodiment, the contact metal 720 is selected from titanium, zirconium, and hafnium. In an embodiment, the contact metal 720 is selected from vanadium, niobium, and tantalum. In an embodiment, the contact metal 720 is selected from cobalt, rhodium, and iridium. In an embodiment, the contact metal 720 is tungsten. In an embodiment, the contact metal 720 is yttrium. In an embodiment, the contact metal 720 is selected from nickel, palladium, and platinum. In an embodiment, the contact metal 720 is selected from lanthanide-series rare earths.

Figure 8:
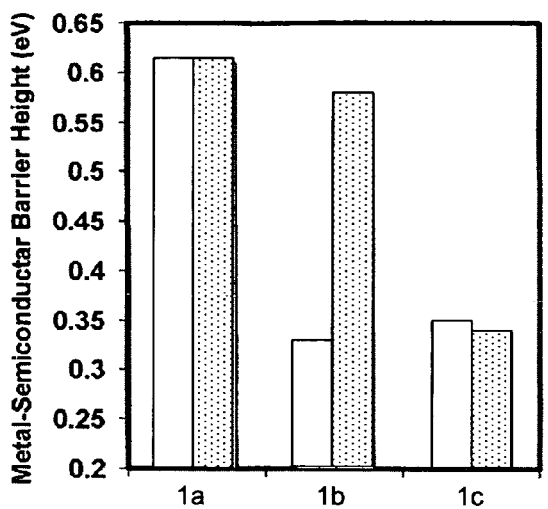
FIG. 8 is a graph that illustrates the metal-semiconductor barrier height lowering discovered according to an embodiment.

FIG. 8 is a graph that illustrates the metal-semiconductor barrier height lowering discovered according to an embodiment. Item 1a represents as-deposited barrier height (not shaded) and after-anneal (shaded) at 450° C. barrier height as a reference for a metal contact on a semiconductive substrate. Item 1b represents the use of an oxide such as an REOx interlayer for as-deposited barrier height and after-anneal (shaded) barrier height for a metal contact with an interlayer embodiment on a semiconductive substrate. And item 1c represents the use of an oxide such as an REOx interlayer with a metallic barrier for as-deposited barrier height and after-anneal (shaded) barrier height for a metal contact with the interlayer and metallic-barrier embodiment on a semiconductive substrate.

Figure 9:
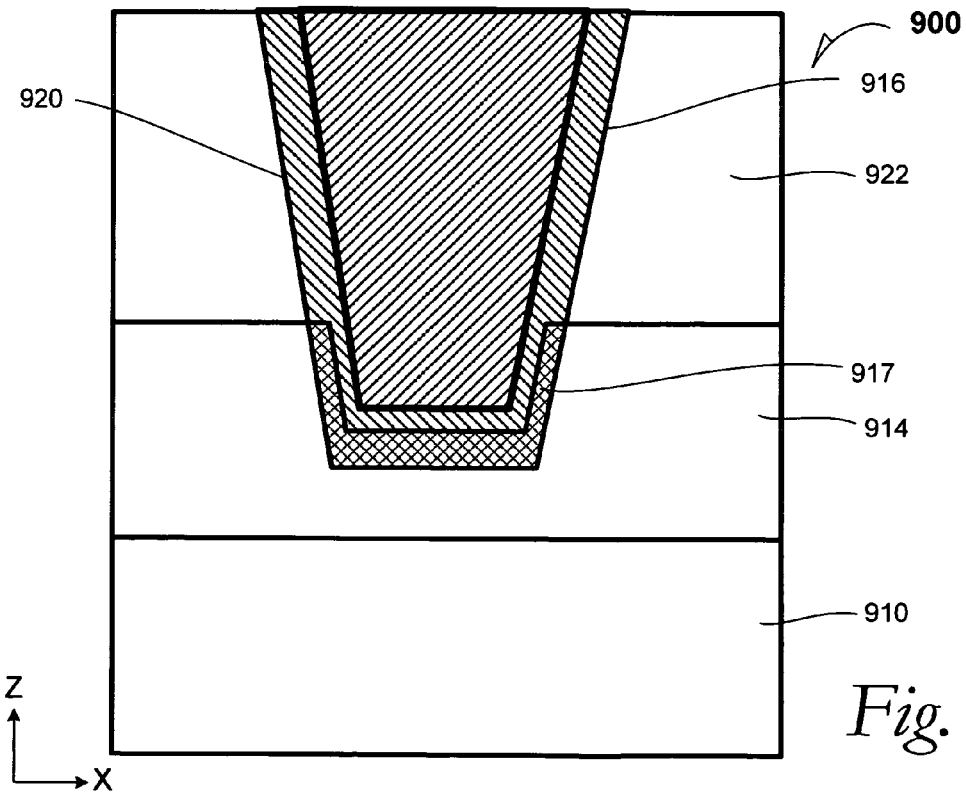
FIG. 9 is a cross-section elevation of a semiconductive device according to an example embodiment.

FIG. 9 is a cross-section elevation of a semiconductive device 900 according to an example embodiment. The semiconductive device 900 may be used to form an NMOS or PMOS integrated circuits. The semiconductive device 900 includes a semiconductive substrate 910. In an embodiment, the semiconductive substrate 910 may include source- and drain wells. An epitaxial semiconducting film 914 is disposed above the semiconductive substrate 910 and an ILD 922 may be present into which a recess is formed to allow electrical coupling.

In an embodiment, a MBF 916 is present such as titanium nitride and has a thickness of about 10 Å. A dielectric film 917 is present as silicon nitride ($Si_xN_y$) and at about 10 Å thickness. The MBF 916 is useful as a diffusion barrier, and the dielectric film 917 has been formed by annealing a portion of the MBF 916 such that a nitride forms between the titanium of the MBF 916 and the silicon of the epitaxial semiconducting film 914. In an embodiment, the dielectric film 917 has a thickness range from 5 Å to 40 Å.

In an embodiment, the MBF 916 is present as titanium nitride, and after the anneal, the dielectric film 917 has formed as silicon nitride ($Si_xN_y$). In an embodiment, the MBF 916 is present as tantalum nitride, and after the anneal, the dielectric film 917 has formed as silicon nitride ($Si_xN_y$). Other nitride compounds may be used to achieve silicide dielectric films 917 according to a specific application need.

In an embodiment, the MBF 916 is present as tantalum carbide, and after the anneal, the dielectric film 917 has formed as silicon carbide (SiC). In an embodiment, the MBF 916 is present as hafnium carbide, and after the anneal the dielectric film 917 has formed as silicon carbide (SiC). Other metal carbide compounds may be used to achieve carbide dielectric films 917 according a specific application need.

In an embodiment, the MBF 916 is present as zinc sulfide, and after the anneal, the dielectric film 917 has formed as silicon sulfide ($SiS_2$). In an embodiment, the MBF 916 is present as aluminum sulfide ($Al_2S_3$), and after the anneal, the dielectric film 917 has formed as silicon sulfide ($SiS_2$). Other metal sulfide compounds may be used to achieve sulfide dielectric films 917 according a specific application need.

In an embodiment, the epitaxial semiconducting film 914 is a III-V compound and a III-V nitride 917 is formed similar to any of the nitride embodiments set forth above. In an embodiment, the epitaxial semiconducting film 914 is a III-V compound and a III-V carbide 917 is formed similar to any of the carbide embodiments set forth above. In an embodiment, the epitaxial semiconducting film 914 is a III-V compound and a III-V sulfide 917 is formed similar to any of the sulfide embodiments set forth above.

Other dielectric film embodiments may be achieved by anneal processing of an MBF to achieve an unpinning effect, depending upon a specific application need. In an example embodiment, a non-stoichiometric MBF 916 metal compound is used and annealed to achieve a dielectric film 917 similar to any of the embodiments set forth above.

In an embodiment, the contact metal 920 is aluminum. In an embodiment, the contact metal 920 is selected from titanium, zirconium, and hafnium. In an embodiment, the contact metal 920 is selected from vanadium, niobium, and tantalum. In an embodiment, the contact metal 920 is selected from cobalt, rhodium, and iridium. In an embodiment, the contact metal 920 is tungsten. In an embodiment, the contact metal 920 is yttrium. In an embodiment, the contact metal 920 is selected from nickel, palladium, and platinum. In an embodiment, the contact metal 920 is selected from lanthanide-series rare earths.

Figure 10:
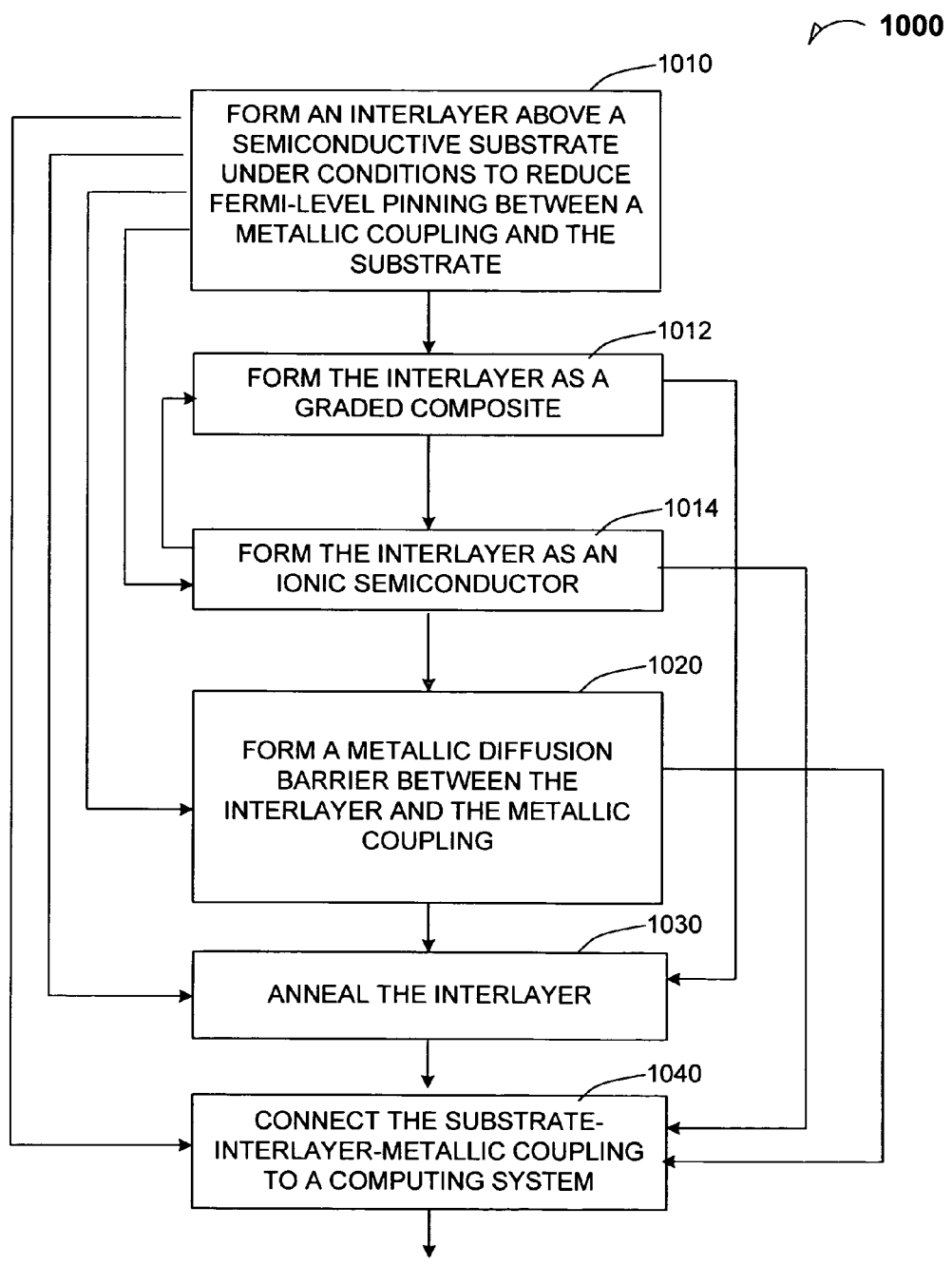
FIG. 10 is a process and method flow diagram according to example embodiments.

FIG. 10 is a process and method flow diagram 1000 according to example embodiments.

At 1010, the process includes forming a dielectric interlayer above a semiconductive substrate under conditions to reduce Fermi-level pinning that is indigenous to the substrate and a metallic coupling that contacts the dielectric interlayer. In a non-limiting example embodiment, an S/D structure including an REOx interlayer 116 (FIG. 1) is formed between a semiconductive substrate 114 (epitaxial layer) and a metallic coupling 118. In a non-limiting example embodiment, a gate-stack structure including an REOx interlayer 117 is formed above a gate dielectric 124 and a gate electrode 126. In a non-limiting example embodiment, a MBF 916 is formed as an interlayer precursor with further processing to be carried at process 1030.

At 1012, the process may include forming the interlayer as a graded composite. In a non-limiting example embodiment, a graded interlayer 416 (FIG. 4a) is formed by altering chemical processing conditions such that an interlayer first film 416a has a first dielectric quantity and an interlayer subsequent film 416d has a subsequent dielectric quality that is different from the first dielectric quantity.

At 1014, the process may include forming the interlayer as an ionic semiconductive interlayer. In a non-limiting example embodiment, an interlayer 416 (FIG. 4) of indium-tin oxide is formed on the semiconductive fin 411. In a non-limiting example embodiment, a graded interlayer 416 (FIG. 4*a*) is formed by altering chemical processing conditions such that an interlayer first film 416*a* has a first ionic amount and an interlayer subsequent film 416*d* has a subsequent amount that is larger than the first ionic amount.

At 1020, the process includes forming a metallic diffusion barrier between the interlayer and the metallic coupling. In a non-limiting example embodiment, a TiN diffusion barrier 717 is formed on an REOx interlayer 716 of ZnO(Al) in contact with a Ni metallic coupling 720.

At 1030, the process includes annealing the interlayer. In a non-limiting example embodiment, the TiN diffusion barrier 717 and REOx interlayer 716 of ZnO(Al) are annealed at 450° C. an one hour. In a non-limiting example embodiment, a TiN interlayer 916 is deposited (process 1010) and an anneal forms a $Si_xN_y$ dielectric film 917 against the epitaxial layer 914.

At 1040 a method embodiment includes installing a substrate-interlayer-metallic coupling embodiment into a computing system.

Figure 11:
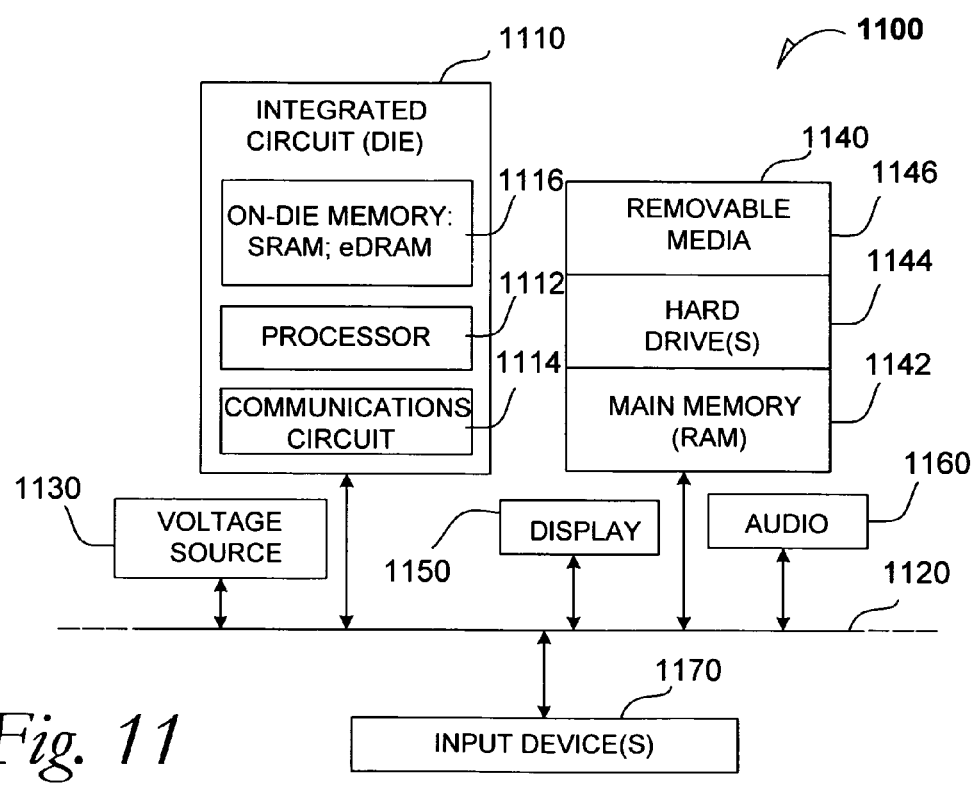
FIG. 11 is a schematic of an electronic computing system according to an embodiment.

FIG. 11 is a schematic of an electronic computing system 1100 according to an embodiment. The electronic system 1100 as depicted can embody semiconductive devices with an interlayer that lowers Fermi-level pinning embodiments as set forth in this disclosure. In an embodiment, the electronic system 1100 is a computer system that includes a system bus 1120 to electrically couple the various components of the electronic system 1100. The system bus 1120 is a single bus or any combination of busses according to various embodiments. The electronic system 1100 includes a voltage source 1130 that provides power to the integrated circuit 1110. In some embodiments, the voltage source 1130 supplies current to the integrated circuit 1110 through the system bus 1120.

The integrated circuit 1110 is electrically coupled to the system bus 1120 and includes any circuit, or combination of circuits according to an embodiment. In an embodiment, the integrated circuit 1110 includes a processor 1112 that can be of any type. As used herein, the processor 1112 may mean any type of circuit such as, but not limited to, a microprocessor, a microcontroller, a graphics processor, a digital signal processor, or another processor. Other types of circuits that can be included in the integrated circuit 1110 are a custom circuit or an application-specific integrated circuit (ASIC), such as a communications circuit 1114 for use in wireless devices such as cellular telephones, pagers, portable computers, two-way radios, and similar electronic systems. In an embodiment, the processor 1110 includes on-die memory 1116 such as static random-access memory (SRAM). In an embodiment, the processor 1110 includes embedded on-die memory 1116 such as embedded dynamic random-access memory (eDRAM) that can be a cache memory for the processor.

In an embodiment, the electronic system 1100 also includes an external memory 1140 that in turn may include one or more memory elements suitable to the particular application, such as a main memory 1142 in the form of RAM, one or more hard drives 1144, and/or one or more drives that handle removable media 1146, such as diskettes, compact disks (CDs), digital variable disks (DVDs), flash memory keys, and other removable media known in the art. The various memory functionalities can contain semiconductive devices with an interlayer that lowers Fermi-level pinning embodiments disposed above a semiconductive first structure.

In an embodiment, the electronic system 1100 also includes a display device 1150, an audio output 1160. In an embodiment, the electronic system 1100 includes a controller 1170, such as a keyboard, mouse, trackball, game controller, microphone, voice-recognition device, or any other device that inputs information into the electronic system 1100.

As shown herein, the integrated circuit 1110 can be implemented in a number of different embodiments, including semiconductive devices with an interlayer that lowers Fermi-level pinning embodiments disposed above a semiconductive first structure, an electronic system, a computer system, one or more methods of fabricating an integrated circuit, and one or more methods of fabricating an electronic assembly that includes semiconductive devices with an interlayer that lowers Fermi-level pinning embodiments disposed above a semiconductive first structure as set forth herein in the various embodiments and their art-recognized equivalents. The elements, materials, geometries, dimensions, and sequence of operations can all be varied to suit particular transistor apparatus with semiconductive devices with an interlayer that lowers Fermi-level pinning embodiments.

Although a processor chip and a memory chip may be mentioned in the same sentence, it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A semiconductive device comprising:
   a semiconductive substrate, the semiconductive substrate having one of a source and a drain;
   an epitaxial semiconducting film disposed over said one of the source and the drain;

a metallic coupling, wherein said metallic coupling is a contact disposed above and over the epitaxial semiconducting film; and a rare-earth oxide film interlayer disposed between the epitaxial semiconducting film and the metallic coupling, wherein the rare-earth oxide film interlayer is in contact with the epitaxial semiconducting film and also in contact with the metallic coupling, wherein the interlayer has a thickness and a composition that reduces Fermi-level pinning that is indigenous to the semiconductive substrate and the metallic coupling, wherein the interlayer is in a thickness range from 2.5 Å to 50 Å.

2. The semiconductive device of claim 1, wherein the rare-earth oxide is non-stoichiometric yttrium oxide.

3. The semiconductive device of claim 1, wherein the rare-earth oxide is a lanthanide-series metal oxide.

4. The semiconductive device of claim 1, wherein the rare-earth oxide is a non-stoichiometric lanthanide-series metal oxide.

5. The semiconductive device of claim 1, wherein the rare-earth oxide is an actinide-series metal oxide.

6. The semiconductive device of claim 1, wherein the rare-earth oxide is a non-stoichiometric actinide-series metal oxide.

7. The semiconductive device of claim 1, wherein the rare-earth film interlayer further includes:
a metallic barrier film (MBF), selected from a metal nitride, a metal carbide, a metal sulfide, and a metal silicide, wherein the MBF has a thickness range from 2.5 Å to 15 Å, and wherein interlayer has a total thickness in a range from 5 Å to 50 Å.

8. The semiconductive device of claim 7 wherein the MBF is a nitride.

9. The semiconductive device of claim 7 wherein the MBF is a carbide.

10. The semiconductive device of claim 7 wherein the MBF is a sulfide.

11. The semiconductive device of claim 7 wherein the MBF is one of a non-stoichiometric compound selected from a carbide, a nitride, and a sulfide.

12. A semiconductive device comprising:
a semiconductive substrate, the semiconductive substrate having one of a source and a drain in a transistor device;
an epitaxial semiconducting film disposed over said one of the source and the drain;
a metallic coupling, wherein the metallic coupling is a contact disposed above the epitaxial semiconducting film; and
a rare-earth oxide film interlayer disposed between the epitaxial semiconducting film and the metallic coupling, wherein the rare-earth oxide film interlayer is in contact with the epitaxial semiconducting film and also in contact with the metallic coupling, wherein the interlayer has a thickness and a composition that reduces Fermi-level pinning that is indigenous to the semiconductive substrate and the metallic coupling, and wherein the rare-earth film interlayer further includes:
a rare-earth oxide film disposed on the epitaxial semiconducting film, wherein the oxide film has a thickness range from 2.5 Å to 15 Å; and
a metallic barrier film (MBF), selected from a metal nitride, a metal carbide, a metal sulfide, and a metal silicide, and wherein the interlayer has a total thickness in a range from 5 Å to 50 Å.

13. The semiconductive device of claim 12, wherein the MBF is a nitride, and wherein the MBF has a thickness range from 2.5 Å to 15 Å.

14. The semiconductive device of claim 12, wherein the MBF is a carbide, and wherein the MBF has a thickness range from 2.5 Å to 15 Å.

15. The semiconductive device of claim 12, wherein the MBF is a sulfide, and wherein the MBF has a thickness range from 2.5 Å to 15 Å.

16. The semiconductive device of claim 12, wherein the MBF is a non-stoichiometric compound selected from the group consisting of a carbide, a nitride, and a sulfide.

17. The semiconductive device of claim 12, wherein the MBF is titanium nitride, and wherein the metallic coupling is a titanium-aluminum alloy.

* * * * *